(12) United States Patent
Wu

(10) Patent No.: US 9,368,748 B2
(45) Date of Patent: Jun. 14, 2016

(54) DISPLAY DEVICE AND MANUFACTURING METHOD THEREOF

(71) Applicant: Shenzhen China Star Optoelectronics Technology Co., Ltd., Shenzhen, Guangdong (CN)

(72) Inventor: Tai-pi Wu, Guangming (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 108 days.

(21) Appl. No.: 14/129,994

(22) PCT Filed: Jun. 26, 2013

(86) PCT No.: PCT/CN2013/078084
§ 371 (c)(1),
(2) Date: Dec. 30, 2013

(87) PCT Pub. No.: WO2014/180044
PCT Pub. Date: Nov. 13, 2014

(65) Prior Publication Data
US 2014/0332774 A1  Nov. 13, 2014

(30) Foreign Application Priority Data

May 9, 2013 (CN) .......................... 2013 1 0167897

(51) Int. Cl.
*H01L 51/56* (2006.01)
*H01L 51/52* (2006.01)

(52) U.S. Cl.
CPC .......... *H01L 51/5246* (2013.01); *H01L 51/524* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 6,833,668 B1 * | 12/2004 | Yamada et al. | 313/505 |
| 6,933,537 B2 * | 8/2005 | Yee et al. | 257/99 |
| 7,109,654 B2 * | 9/2006 | Song et al. | 313/512 |
| 7,411,345 B2 * | 8/2008 | Lee et al. | 313/512 |
| 7,572,162 B2 * | 8/2009 | Omura et al. | 445/24 |
| 7,608,995 B2 * | 10/2009 | Lee et al. | 313/505 |
| 2003/0062533 A1 * | 4/2003 | Yee et al. | 257/99 |
| 2007/0120480 A1 * | 5/2007 | Kwon | 313/512 |
| 2007/0164672 A1 | 7/2007 | Omura et al. | |

FOREIGN PATENT DOCUMENTS

| | | |
|---|---|---|
| CN | 1951154 A | 4/2007 |
| CN | 102255056 A | 11/2011 |
| JP | 2010228998 A | 10/2010 |

* cited by examiner

*Primary Examiner* — Matthew W Such
*Assistant Examiner* — Abul Kalam
(74) *Attorney, Agent, or Firm* — JMB Davis Ben-David

(57) ABSTRACT

For a display device and manufacturing method for the display device, the method comprises steps of: disposing a plurality of recesses on the cover body; coating glass frit in the recesses; sintering the glass frit for forming sintered blocks; disposing display auxiliary members on the cover body having the sintered blocks formed thereon; and irradiating the sintered blocks by laser to combine the cover and the display substrate with the sintered blocks.

The present invention can prevent the display auxiliary members of the cover from being damaged in the packaging process of the display device.

19 Claims, 4 Drawing Sheets

DISPLAY DEVICE AND MANUFACTURING METHOD THEREOF

BACKGROUND OF THE INVENTION

1. Field of Invention

The present invention relates to a field of display technology. In particular, it pertains to a display device and a manufacturing method thereof.

2. Description of Prior Art

In conventional packaging process of an Organic Light Emitting Diode (OLED) display device, the glass frit applied on a cover is required to be sintered at a temperature greater than 500 degree Celsius for the packaging the cover and the display substrate.

The Inventor finds that in practice the prior art exists at least the following problem:

Due to the limitation imposed by the sintering process mentioned above (temperature greater than 500 degree Celsius on the cover of conventional OLED display devices), the processes of the other display auxiliary members cannot be executed, such as a color filter member process or a touch-sensitive member process). This is because the heat can damage the display auxiliary members, resulting in poor product quality for the display device.

Therefore, it is necessary to propose a new technical solution to solve these technical problems.

BRIEF SUMMARY OF THE INVENTION

One object of the present invention is to provide a manufacturing method for a display device such that the method prevents the display auxiliary members of the cover from being damaged in the packaging process of the display device.

For solving the above problem, the present invention provides a technical scheme as stated below:

A display device manufacturing method is disclosed. The display device comprises a display substrate and a cover. The cover comprises a cover body, sintered blocks and display auxiliary members. The method comprises steps of: disposing a plurality of recesses on an edge of the cover body facing a surface of the display substrate; coating glass frit in part of the recesses or all of the recesses; sintering the glass frit for forming the sintered blocks; disposing the display auxiliary members on the cover body having the sintered blocks formed thereon; irradiating the sintered blocks by a laser to combine the cover and the display substrate with sintered blocks. The recesses are formed by etching. In addition, an average depth of the recesses is less than a height of the sintered blocks.

In the display device manufacturing method mentioned above, wherein a shape of a projection of each of the recesses on a plane of the cover body is circular, rectangular, triangular, polygonal, or irregular; a radius of a minimum circumscribed circle of the projection is from 1 micron to 200 microns.

In the display device manufacturing method mentioned above, the radius of a minimum circumscribed circle of the projection is from 50 microns to 150 microns.

In the display device manufacturing method mentioned above, the radius of a minimum circumscribed circle of the projection is from 80 microns to 120 microns.

In the display device manufacturing method mentioned above, the recessed portion is arranged as an array on the edge of the cover body.

Another object of the present invention is to provide a manufacturing method for a display device. The method prevents the display auxiliary members of the cover from being damaged in the packaging process of the display device.

For solving above problems, the present invention provides a technical scheme as stated below:

A display device manufacturing method, the display device comprises a display substrate and a cover; the cover comprises a cover body, sintered blocks and display auxiliary members; the method comprises steps of: disposing a plurality of recesses on an edge of the cover body facing a surface of the display substrate; coating glass frit in part of the recesses or all of the recesses; sintering the glass frit for forming the sintered blocks; disposing the display auxiliary members on the cover body of the formed sintered blocks; irradiating the sintered blocks by a laser to combine the cover and the display substrate with the sintered blocks.

In the display device manufacturing method mentioned above, the recesses are formed by etching.

In the display device manufacturing method mentioned above, an average depth of the recesses is less than a height of the sintered blocks.

In the display device manufacturing method mentioned above, wherein a shape of a projection of each of the recesses on a plane of the cover body is circular, rectangular, triangular, polygonal, or irregular; a radius of a minimum circumscribed circle of the projection is from 1 micron to 200 microns.

In the display device manufacturing method mentioned above, the radius of a minimum circumscribed circle of the projection is from 50 microns to 150 microns.

In the display device manufacturing method mentioned above, the radius of a minimum circumscribed circle of the projection is from 80 microns to 120 microns.

In the display device manufacturing method mentioned above, the recessed portion is arranged as an array on the edge the cover body.

Another object of the present invention is to provide a manufacturing method for a display device which can prevent the display auxiliary members of the cover from being damaged in the packaging process of the display device.

For solving the above problem, the present invention provides a technical scheme as stated below:

A display device, wherein the display device comprises: a display substrate for generating a display image; a cover overlaps with the display substrate to form one entity, wherein the cover comprises: a cover body disposes a plurality of recesses on an edge of the cover body facing a surface of the display substrate; sintered blocks are disposed in a portion of or all of the recesses for combining the display substrate and the cover, wherein the sintered blocks are formed by sintering the glass frit, which is disposed in a portion of or all of the recesses; and display auxiliary members are disposed on the cover body, which the sintered blocks are formed, for assisting the display substrate in providing a display image.

In the display device mentioned above, the recesses are formed by etching.

In the display device mentioned above, an average depth of the recesses is less than a height of the sintered blocks.

In the display device mentioned above, wherein a shape of a projection of each of the recesses on a plane of the cover body is circular, rectangular, triangular, polygonal, or irregular; a radius of a minimum circumference of the projection is from 1 micron to 200 microns.

In the display device mentioned above, the radius of a minimum circumscribed circle of the projection is from 50 microns to 150 microns.

In the display device mentioned above, the radius of a minimum circumscribed circle of the projection is from 80 microns to 120 microns.

In the display device mentioned above, the recessed portion is arranged as an array on the edge of the cover body.

In the prior art, the sintered blocks are formed after the display auxiliary members are disposed on the cover. In the embodiment of the present invention, the sintered blocks are formed on the cover before the display auxiliary members are disposed. Thus, the display auxiliary members will not be damaged by high temperatures during the sintering process with the glass frit.

In order to make the present invention more understandable, the preferred embodiments and drawings of the present invention are given in detail below:

DETAILED DESCRIPTION OF THE PREFERRED EMBODIMENTS

Figure 1:
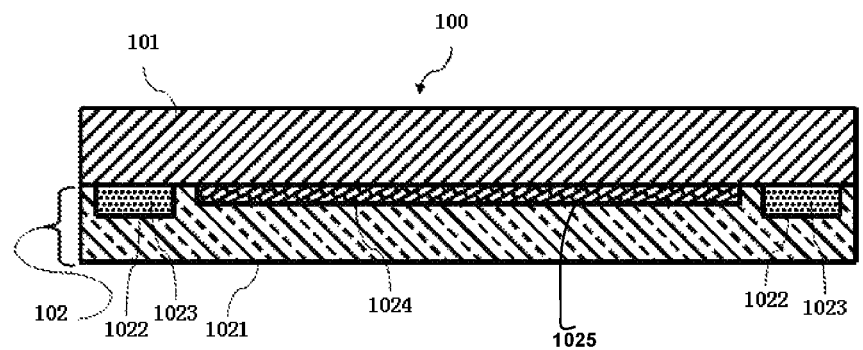
FIG. 1 is a sectional view of a first embodiment of a display device of the present invention.

The following description of every embodiment, with reference to the accompanying drawings, is used to exemplify a specific embodiment which may be carried out in the present invention. Directional terms mentioned in the present invention, such as "top", "bottom", "front", "back", "left", "right", "inside", "outside", "side" etc., are only used with reference to the orientation of the accompanying drawings. Therefore, the used directional terms are intended to illustrate, but not to limit, the present invention. In the drawings, the components having similar structures are denoted by the same numerals.

A display device of the present invention compromises a display substrate and a cover, wherein the display substrate compromises: a substrate main body (not shown), a first electrode (not shown), an organic light emitting layer (not shown), and a second electrode (not shown). The first electrode, the organic light emitting layer and the second electrode are formed on the substrate main body in their turn. The main substrate body can be a material such as a glass substrate, a flexible plastic substrate, a wafer substrate, or a heat sink. The display substrate can compromise a plurality of pixel areas (not shown), a plurality of signal lines (not shown), and switch members. (not shown) The signal lines can transfer data, such as scan data, information data or test data. The signal lines can be a data line disposed perpendicularly and a gate electrode line disposed horizontally which, when disposed interlaced, form a pixel area arranged in an array for displaying an image. The switch members can be a thin film transistor (TFT), disposed in each of the pixel areas, electrically connecting with the adjacent signal line.

In the present invention, the first electrode can be anode, and the second electrode can be cathode. The organic light emitting layer can compromise a hole (electron hole) injection layer, a hole transport layer (such as white light or a different color of organic light emitting layer) and an electron transport layer, each of which disposed on the first electrode in their turn. The organic light emitting layer can drive light by the current provided by the switch members, then through the transparent second electrode to light outside.

Figure 2:
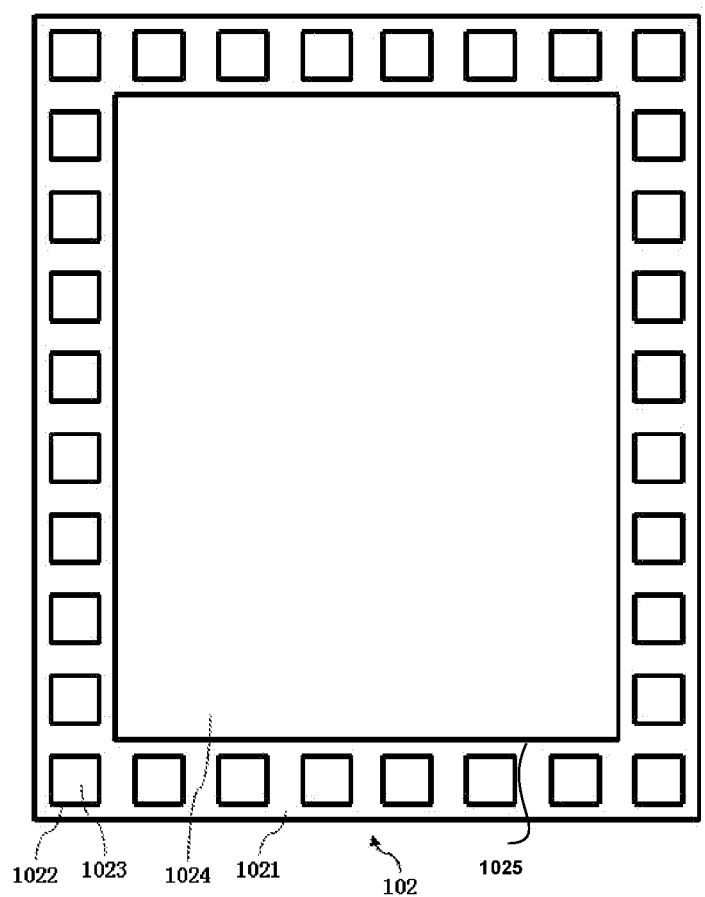
FIG. 2 is a top view of a cover in FIG. 1.

FIG. 1 is a sectional view of a display device 100 of the present invention, and FIG. 2 is a top view of a cover 102 in FIG. 1 (Please refer to FIG. 1 and FIG. 2).

The display device of the present invention compromises a display substrate 101 and a cover 102. Display substrate 101 is used for generating the display image.

The cover 102 overlaps with the display substrate 101. The display substrate 101 and the cover 102 are combined to form one entity by packaging technology.

the cover 102 compromises: a cover body 1021, sintered blocks 1023 and display auxiliary members 1024, in which a plurality of recesses 1022 are disposed on an edge of the cover body facing a surface of the display substrate, in which a cavity 1025 is disposed on the cover body facing the surface of the display substrate, in the embodiment of the present invention, the recesses 1022 and the cavity 1025 are formed by etching.

Sintered blocks 1023 are disposed in a portion of or all of the recesses 1022, and the sintered blocks 1023 are used for combining the display substrate 101 and the cover 102 by laser irradiation. The sintered blocks 1023 are formed by previously sintering the glass frit, which is disposed in a portion of or all of the recesses 1022. The display auxiliary members 1024 are disposed on the cover body 1021. In detail, the display auxiliary members 1024 are disposed in the cavity 1025, which are disposed between at least two sintered blocks, which is previously sintered. Specifically, in the embodiment of the present invention, as in FIG. 2, recessed portion 1022 is arranged as an array on the edge of the cover body 1021, and the display auxiliary members 1024 are surrounded by the recesses 1022 on the cover body 1021. The display auxiliary members 1024 are used for assisting the display substrate 101 in providing a display image. As such, display auxiliary 1024 can be a color filter member, a touch sensing member, or so on.

In the embodiment of the present invention, the recesses 1022 are disposed on the cover body 1021. The glass frit coated on the cover body 1021 can hide in the recesses 1022. In the packaging process of display substrate 101 and the cover 102, the sintered blocks 1023 can combine the cover 102 and the display substrate 101 by laser irradiation. Also, the glass frit would not separate the display substrate 101 and the cover 102.

The recesses 1022 can also effectively control the distribution of the glass frit coated thereon (i.e. the glass frit will not move randomly). Further, the quantity of the glass frit can be controlled precisely and normally, thereby preventing the glass frit in the cover body 1021 from being either excessive or lacking and allowing flat packaging between the display substrate 101 and the cover 102 (flat, horizontal engagement).

Also, in the embodiment of the present invention, as the sintered blocks 1023 are formed on the cover 102 prior to the display auxiliary members 1024 being disposed on the cover 102 (as opposed to the sintered blocks 1023 being formed on the cover 102 after the display auxiliary members 1024 are disposed on the cover 102), then the display auxiliary members 1024 will not be damaged by high temperatures during the process of sintering the glass frit.

In the embodiment of the present invention, an average depth of the recesses 1022 is less than a height of the sintered blocks 1023, ensuring that the sintered blocks 1023 on the cover 102 can be combined to form one entity with the display substrate after laser irradiation.

In the embodiment of present invention, a shape of a projection of the recesses 1022 on a plane of the cover body 1021 is rectangular, as shown in FIG. 2. Of course, the projection can be circular, rectangular, triangular, polygonal, or irregular.

The radius of a minimum circumscribed circle of the projection is from 1 micron to 200 microns. As such, the radius can be 1, 5, 8, 15, 29, 46, 77, 98, 133, 165, 182, 200 microns, and so on.

Figure 3:
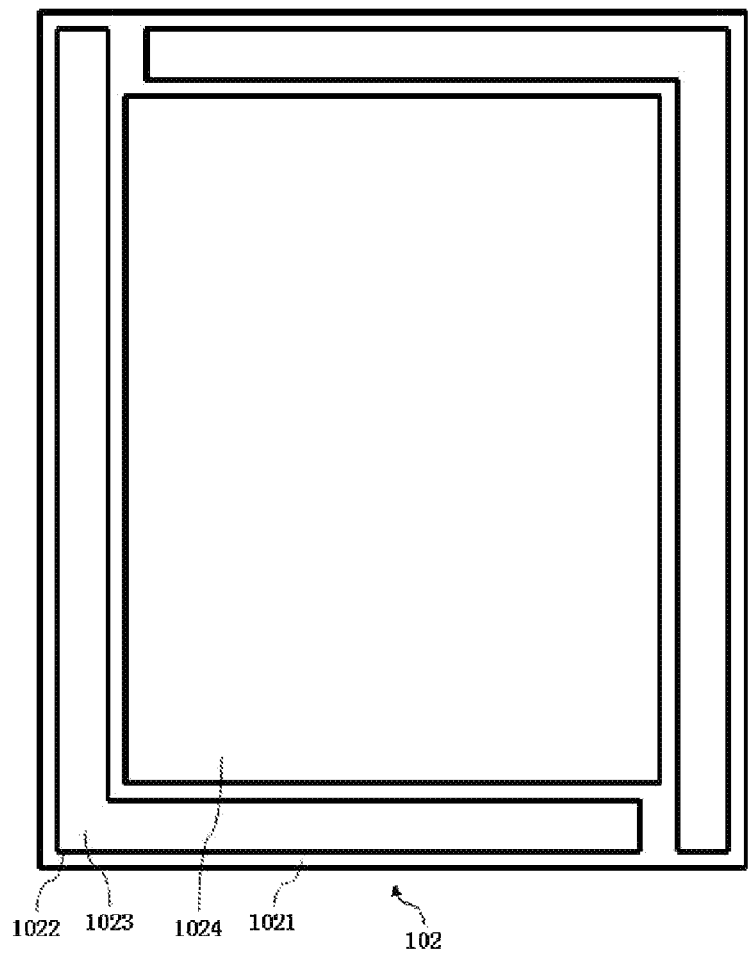
FIG. 3 is a top view of the first embodiment of the display device of the present invention.

FIG. 3 is the top view of the cover 102 in the second embodiment of the display device of the present invention (Please refer to FIG. 3). This embodiment is similar to the first embodiment. The difference is, specifically, the projection is "L" shaped. The two "L" shapes of the recesses 1022 are disposed relatively on the edge of the cover body 1021 to form a shape similar to a rectangle. The sintered blocks 1023, previously sintered, are disposed in the recesses 1022 of the "L" shape. The display auxiliary members 1024 are disposed on the cover 102 with the sintered blocks 1023.

The third embodiment of the display device of the present invention is similar to the first or second embodiment. The difference is the radius of a minimum circumscribed circle of the projection is from 50 microns to 150 microns. As such, the radius can be 73, 88, 96, 107, 123, 135, 144 and 150 microns.

The fourth embodiment of the display device of the present invention is similar to the first, second and third embodiments. The difference is the radius of a minimum circumscribed circle of the projection is from 80 microns to 120 microns. As such, the radius can be 80, 86, 98, 100, 106, 113, 115 and 120 microns.

Figure 4:
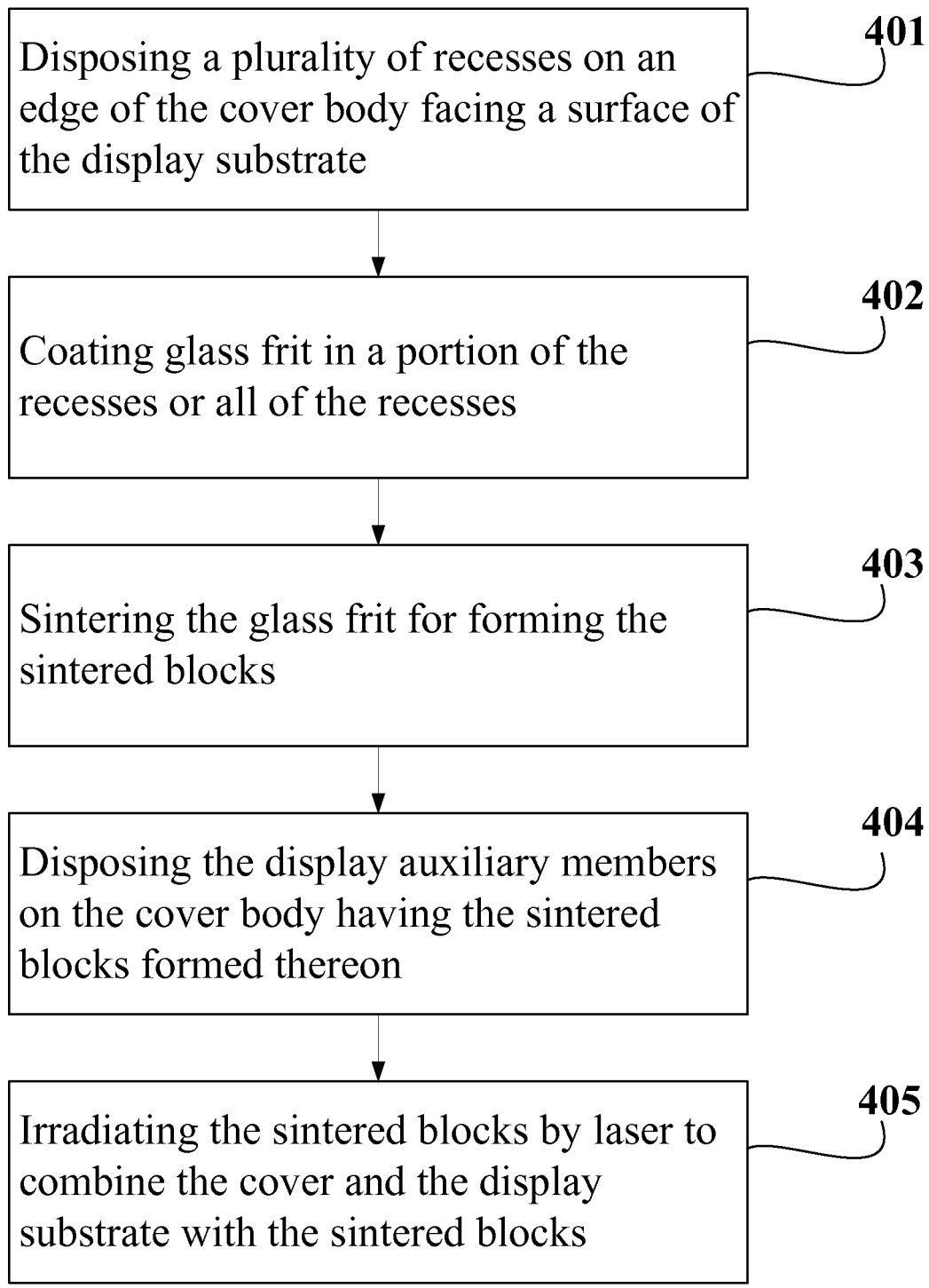
FIG. 4 is a flow chart of the manufacturing method of the display device of the present invention.

FIG. 4 is the flow chart of the manufacturing method of the display device of the present invention (Please refer to FIG. 4).

The display device of the embodiment comprises a display substrate and a cover, the cover comprises A COVER body, sintered blocks and display auxiliary members.

The manufacturing method of display device 100 of the embodiment comprises the below steps:

S401, disposing a plurality of recesses 1022 on an edge of a cover body 1021 of the cover 102 facing a surface of the display substrate 101. Specifically, disposing the recesses 1022 on the edge of the cover body 1021 facing the surface of display substrate 1024 by etching technology.

S402, coating glass frit in a portion of or all of the recesses 1022.

S403, sintered blocks 1023 are formed by sintering the glass frit. The sintered blocks 1023 are used for combining the display substrate 101 and the cover 102 by laser irradiation.

S404, the display auxiliary members 1024 are disposed on the cover body 1021 having the sintered blocks formed thereon, which can be disposed between at least two sintered blocks 1023, which are previously sintered. Specifically, in the embodiment of the present invention, as in FIG. 2, the recessed portion 1022 is arranged as an array on the edge of the cover body 1021, the display auxiliary members 1024 are surrounded by the recesses 1022 on the cover body 1021. The display auxiliary 1024 is used for assisting the display substrate 101 in providing a display image. As such, the display auxiliary 1024 can be a color filter member or a touch sensing member, or so on.

S405, by laser irradiation on the sintered blocks 1023, combining the sintered blocks 1023 with the cover 102 and the display substrate 101.

In the embodiment of the present invention, the recesses 1022 are disposed on the cover body 1021. The glass frit coated on the cover body 1021 can hide in the recesses 1022. In the packaging process of the display substrate 101 and the cover 102, the sintered blocks 1023 can combine the cover 102 and the display substrate 101 by laser irradiation. Also, the glass frit would not separate the display substrate 101 and the cover 102.

The recesses 1022 can also effectively control the distribution of the glass frit coated thereon (i.e. the glass frit will not move randomly). Further, the quantity of the glass frit can be controlled precisely and normally, thereby preventing the glass frit in the cover body 1021 from being either excessive or lacking and allowing flat packaging between display substrate 101 and the cover 102 (flat, horizontal engagement).

Also, in the embodiment of the present invention, as the sintered blocks 1023 are formed on the cover 102 prior to the display auxiliary members 1024 being disposed on the cover 102 (as opposed to the sintered blocks 1023 being formed on the cover 102 after the display auxiliary members 1024 are disposed on the cover 102), then the display auxiliary members 1024 will not be damaged by high temperatures during the process of sintering the glass frit.

In the embodiment of the present invention, an average depth of the recesses 1022 is less than a height of the sintered blocks 1023, ensuring that the sintered blocks 1023 on the cover 102 can be combined to form one entity with the display substrate after laser irradiation.

In the embodiment of present invention, a shape of a projection of the recesses 1022 on a plane of the cover body 1021 is rectangular, as shown in FIG. 2. Of course, the projection can be circular, rectangular, triangular, polygonal, or irregular.

The radius of a minimum circumscribed circle of the projection is from 1 micron to 200 microns. As such, the radius can be 1, 5, 8, 15, 29, 46, 77, 98, 133, 165, 182, 200 microns, and so on.

The second embodiment of the manufacturing method of the display device 100 of the present invention is similar to the first embodiment. The difference is, specifically, that the projection is "L" shaped. The two "L" shapes of the recesses 1022 are disposed relatively on the edge of the cover body 1021 to form a shape similar to a rectangle, in which the sintered blocks 1023, previously sintered, are disposed in the recesses 1022 of the "L" shape. The display auxiliary members 1024 are disposed on the cover 102 with the sintered blocks 1023.

The third embodiment of the manufacturing method of the display device 100 of the present invention is similar to the first and second embodiments. The difference is that the radius of a minimum circumscribed circle of the projection is from 50 microns to 150 microns. As such, the radius can be 73, 88, 96, 107, 123, 135, 144 and 150 microns.

The forth embodiment of manufacturing method of display device 100 of the present invention is similar to the first, second and third embodiments. The difference is that the radius of a minimum circumscribed circle of the projection is from 80 microns to 120 microns. As such, the radius can be 80, 86, 98, 100, 106, 113, 115 and 120 microns.

Although the present invention has been disclosed as preferred embodiments, the foregoing preferred embodiments are not intended to limit the present invention. Those of ordinary skill in the art, without departing from the spirit and scope of the present invention, can make various kinds of modifications and variations to the present invention. Therefore, the scope of the claims of the present invention must be defined.

What is claimed is:

1. A method for manufacturing a display device, the display device comprises a display substrate and a cover, the cover comprises a cover body, sintered blocks and display auxiliary members, the method comprises steps of:

disposing a plurality of recesses on an edge of the cover body facing a surface of the display substrate;

coating glass frit in a portion of the recesses or all of the recesses;

sintering the glass frit for forming the sintered blocks in the cover body;

disposing the display auxiliary members in a cavity formed on the cover body; and irradiating the sintered blocks by laser to tightly and evenly combine the cover and the display substrate, such that there is no gap between a surface of the cover and a surface of the display substrate, and wherein the sintered blocks and the display auxiliary members are disposed on the cover during the irradiating process;

wherein the recesses are formed by etching and wherein an average depth of the recesses is less than a height of the sintered blocks.

2. The method for manufacturing the display device according to claim 1, wherein a shape of a projection of each of the recesses on a plane of the cover body is circular, rectangular, triangular, polygonal, or irregular;

a half of a minimum width of the projection is from 1 micron to 200 microns.

3. The method for manufacturing the display device according to claim 2, wherein the half of a minimum width of the projection is from 50 microns to 150 microns.

4. The method for manufacturing the display device according to claim 3, wherein the half of a minimum width of the projection is from 80 microns to 120 microns.

5. The method for manufacturing the display device according to claim 2, wherein the recesses are arranged as an array on the edge of the cover body.

6. A method for manufacturing a display device, the display device includes a display substrate, and a cover; the cover comprises cover body, sintered blocks and display auxiliary members; the method comprises steps of:

disposing a plurality of recesses on an edge of the cover body facing a surface of the display substrate;

coating glass frit in a portion of the recesses or all of the recesses;

sintering the glass frit for forming the sintered blocks;

disposing the display auxiliary members in a cavity formed on the cover body; and irradiating the sintered blocks by laser to tightly and evenly combine the cover and the display substrate, such that there is no gap between a surface of the cover and a surface of the display substrate, and wherein the sintered blocks and the display auxiliary members are disposed on the cover during the irradiating process.

7. The method for manufacturing the display device according to claim 6, wherein the recesses are formed by etching.

8. The method for manufacturing the display device according to claim 6, wherein an average depth of the recesses is less than a height of the sintered blocks.

9. The method for manufacturing the display device according to claim 6, wherein a shape of a projection of each of the recesses on a plane of the cover body is circular, rectangular, triangular, polygonal, or irregular;

a half of a minimum width of the projection is from 1 micron to 200 microns.

10. The method for manufacturing the display device according to claim 9, wherein the half of a minimum width of the projection is from 50 microns to 150 microns.

11. The method for manufacturing the display device according to claim 10, wherein the half of a minimum width of the projection is from 80 microns to 120 microns.

12. The method for manufacturing the display device according to claim 9, wherein the recesses are arranged as an array on the edge of the cover body.

13. A display device, wherein the display device comprises:

a display substrate for generating display image;

a cover overlaps with the display substrate to form one entity, wherein the cover comprises:

a cover body including a plurality of recesses on an edge of the cover body facing a surface of the display substrate;

sintered blocks are disposed in a portion of or all of the recesses, for combining the display substrate and the cover, wherein the sintered blocks are formed by sintering a glass material, which is disposed in a portion of or all of the recesses; and display auxiliary members are disposed in a cavity formed on the cover body, for assisting the display substrate in providing a display image, wherein the display substrate is tightly and evenly combined with the cover, such that there is no gap between a surface of the cover and a surface of the display substrate.

14. The display device according to claim 13, wherein the recesses are formed by etching.

15. The display device according to claim 13, wherein an average depth of the recesses is less than a height of the sintered blocks.

16. The display device according to claim 13, wherein a shape of a projection of each of the recesses on a plane of the cover body is circular, rectangular, triangular, polygonal, or irregular;

a half of a minimum width of the projection is from 1 micron to 200 microns.

17. The display device according to claim 16, wherein the half of a minimum width of the projection is from 50 microns to 150 microns.

18. The display device according to claim 17, wherein the half of a minimum width of the projection is from 80 microns to 120 microns.

19. The display device according to claim 16, wherein the recesses are arranged as an array on the edge of the cover body.

* * * * *